(12) United States Patent
Kullander-Sjoberg et al.

(10) Patent No.: US 6,285,704 B1
(45) Date of Patent: Sep. 4, 2001

(54) FIELD MODULATED VERTICAL CAVITY SURFACE-EMITTING LASER WITH INTERNAL OPTICAL PUMPING

(75) Inventors: Anna Kullander-Sjoberg, Sollentuva; Michael Widman, Kungsansen, both of (SE)

(73) Assignee: Mitel Semiconductor AB, Jarfalla (SE)

( * ) Notice: Subject to any disclaimer, the term of this patent is extended or adjusted under 35 U.S.C. 154(b) by 0 days.

(21) Appl. No.: 09/114,142

(22) Filed: Jul. 13, 1998

(30) Foreign Application Priority Data

Jul. 14, 1997 (GB) ................................. 9714820
Aug. 27, 1997 (GB) ................................. 9718082

(51) Int. Cl.$^7$ ................................. H10S 3/08
(52) U.S. Cl. ................................. 372/96; 372/96; 372/69; 372/75; 372/44; 372/50
(58) Field of Search ................................. 372/98, 75, 69, 372/44, 45, 46, 50

(56) References Cited

U.S. PATENT DOCUMENTS 5,513,204  4/1996  Jayaraman .

FOREIGN PATENT DOCUMENTS 473982  3/1992  (EP) .
549853  7/1993  (EP) .
WO 98/31080  7/1998  (WO) .

OTHER PUBLICATIONS

"Vertical Cavity Laser with Two Air–Gap Reflectors", Electronics Letters, Jul. 18, 1996, vol. 32 No. 15, pp. 1369–1370.
"Lasing Oscillation of Vertical Microcavity Quantum Dot Lasers", Extended/Abstracts of the 1996 International Conference on Solid State Devices and Materials, Yokohama, 1996, pp. 199–201.

*Primary Examiner*—Frank G. Font
*Assistant Examiner*—Delma R. Flores Ruiz
(74) *Attorney, Agent, or Firm*—Lawrence E. Laubscher, Jr.

(57) ABSTRACT

A vertical cavity surface emitting laser diode (VCSEL), includes top and bottom electrically non-conductive mirrors defining a first laser cavity containing a laser medium and designed to resonate at a first wavelength. A second laser cavity is designed to resonate at a second wavelength less than the first wavelength. The second laser cavity is optically coupled to the first laser cavity so as to pump the laser medium and create laser action in the first laser cavity. The second laser cavity is normally provided by a VCSEL stacked below the first laser cavity.

12 Claims, 1 Drawing Sheet

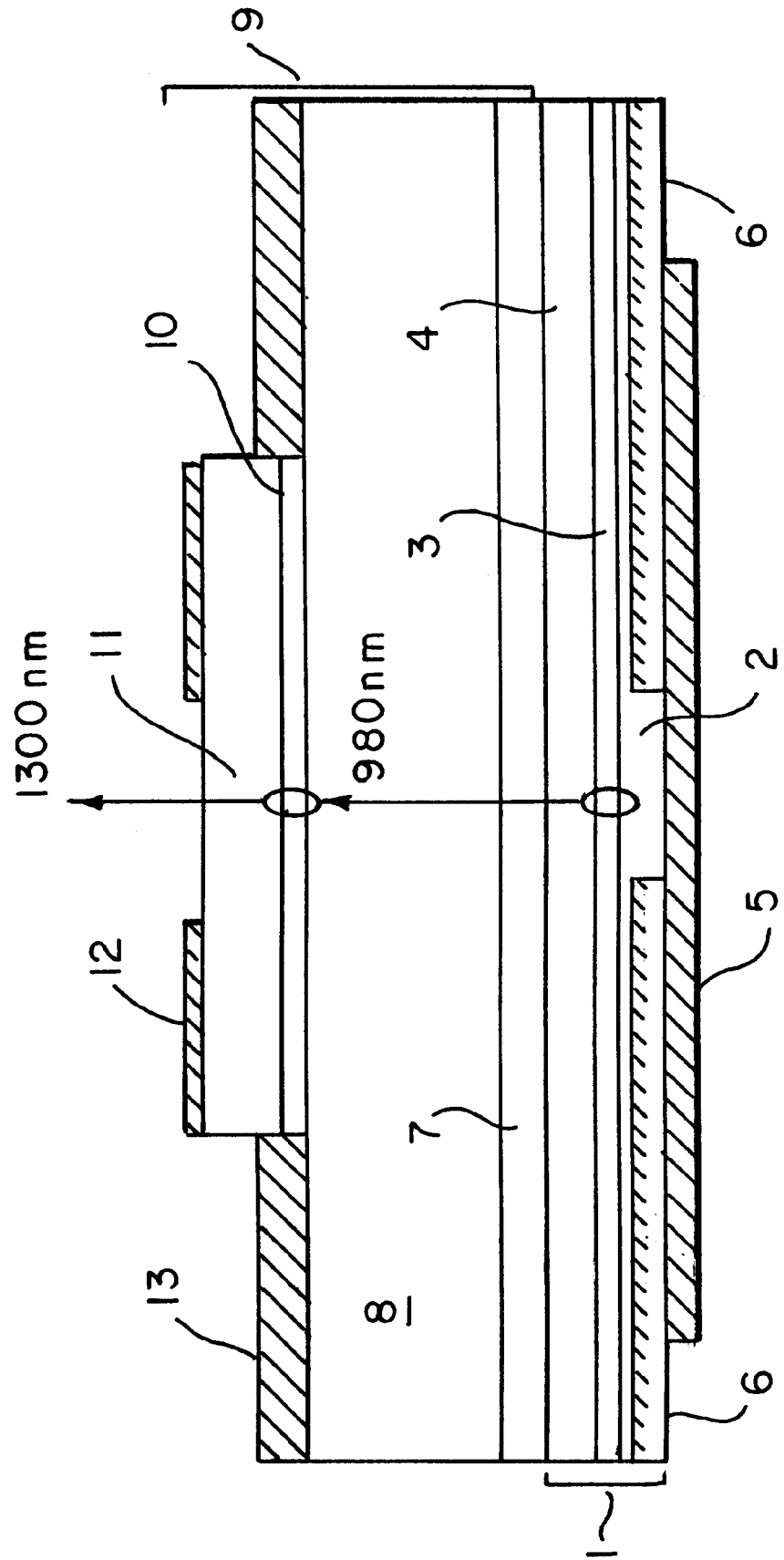

FIELD MODULATED VERTICAL CAVITY SURFACE-EMITTING LASER WITH INTERNAL OPTICAL PUMPING

BACKGROUND OF THE INVENTION

This invention relates to the field of laser diodes, and more particularly to a field modulated vertical cavity surface-emitting laser with an internal optical pumping.

BRIEF DESCRIPTION OF PRIOR ART

VCSELs or vertical cavity surface-emitting laser diodes are known in the art. While 850 nm current modulated VCSEL laser diodes are commercially available, it is hard to realize a 1300 nm VCSEL due to technical difficulties. In a VCSEL, the optical cavity needs to be defined by mirrors having high reflectivity and low loss to create laser action at room temperature. In addition, the mirrors need to be electrically conductive in order to allow current injection.

Up to the present time, it has not been possible to grow mirrors of the desired quality on substrates made of indium phosphide, emitting at 1300 nm.

It has been demonstrated that it is possible to fuse mirrors made of aluminum gallium arsenide and its alloys onto an active layer of if indium gallium arsenide phosphide, emitting at 1300 nm. However, this procedure is complicated. The active layer is only about 100 nm thick and it needs to be separated from the substrate on which it was grown and transported to a substrate containing the first mirror, then the stack consisting of the active layer and the first mirror again need to be transported to a substrate containing the second mirror. Obviously, no significant yield can be expected using this method. Also, three wafers are consumed for each functional device fabricated.

It has been proposed that one of the mirrors be replaced by a dielectric mirror using silicon and low refractive index materials such as oxides, nitrides or even an airgap. The problem is that the mirror is then no longer conductive so that carrier injection pumping is not possible.

An object of the invention is to overcome this problem.

SUMMARY OF INVENTION

According to the present invention there is provided a laser diode structure, comprising top and bottom mirrors defining a first laser cavity containing a laser medium and designed to resonate at a first wavelength, at least one of said mirrors being electrically non-conductive; and a second laser cavity designed to resonate at a second wavelength less than said first wavelength, said second laser cavity being optically coupled to said first laser cavity so as to optically pump said laser medium and create laser action in said first laser cavity.

The laser diode is preferably a VCSEL, (vertical cavity surface emitting laser) diode.

The problems of the prior art are overcome by optically pumping the VCSEL operating at the longer wavelength with a VCSEL operating at a shorter wavelength that can be pumped by other means, such as carrier injection. The optical pumping is preferably carried out with the aid of a second VCSEL, which since it operates at a shorter wavelength can be fabricated on the same substrate in a conventional manner using conductive mirrors and carrier injection pumping. Typically, the main VCSEL operates at 1300 nm and the VCSEL that provides the optical pumping operates at 980 nm.

BRIEF DESCRIPTION OF THE DRAWING

The invention will now be described in more detail, by way of example only, with reference to the accompanying drawings, in which the single FIGURE is a cross section through a VCSEL in accordance with the invention.

DETAILED DESCRIPTION

In the figure, the 1300 nm VCSEL made in accordance with the principle of the invention comprises a conventional 980 nm VCSEL 1 acting as an optical pump and having a bottom mirror 2 of a GaAs/AlGaAs quarterwavelength stack for 1300 nm reflection, an active medium 3 of InGaAs quantum wells confined between GaAs layers or an AlGaAs alloy, and a top mirror 4 of a GaAs/AlGaAs quarterwavelength stack. A backside contact 5 is formed on the backside of the VCSEL 1 and isolation layers 6 are provided in a conventional manner.

An intermediate GaAs buffer layer 7 is deposited on the top mirror 4. The bottom mirror 8 of the main VCSEL 9 is grown on the buffer layer 7. The bottom mirror 8 consists of quarterwavelength stacks of gallium arsenide and aluminium gallium arsenide or alloys thereof. The bottom mirror 8 is not shown to scale. In practice, It should be about half the thickness shown. An active layer 10 consists of indium gallium arsenide phosphide dots grown lattice mismatched to the material of the bottom mirror 8. The quantum dots are embedded in aluminium gallium arsenide or GaAs to form a quantum well.

The top mirror 11 consists of a stack of dielectric material such as a silicon dioxide or silicon nitride based stack, or an airgap based stack.

A ring-shaped contact 12 provides a field electrode. The mirror 11 is surrounded by a ground contact 13.

The above structure can be grown on a single substrate using conventional techniques; i.e. MOVPE, metal organic vapor phase epitaxy or MBE molecular beam epitaxy.

The 980 mn VCSEL diode 1 formed in the same structure as the 1300 nm VCSEL 9 acts as an optical pump to create a population inversion at the active layer 10 of the main VCSEL 9. Since the pumping VCSEL is part of the same structure, there is no need to provide any optical elements to achieve good optical coupling.

The pump VCSEL 1, operating at 980 nm is activated by applying a DC bias between its bottom contact 5 and the bottom mirror 8 of the main VCSEL 9 operating at 1300 nm.

The main VCSEL 9 is modulated by using an external electrical field applied perpendicular to the active layer 10, employing the Stark-effect to deliberately change the bandgap of the active layer 10 and hence move the emission wavelength into and out of resonance with the optical cavity formed between the top and bottom mirrors. The optical output will therefore be modulated by the electrical field and not as by injected carriers. The advantage of this arrangement is that the 1300 nm VCSEL will always be above threshold current so there is less need to use a monitoring device.

The 1300 nm VCSEL 9 has a bottom mirror consisting of aluminum gallium arsenide and its alloys. The active layer consists of indium gallium arsenide phosphide quantum dots which maybe grown lattice mismatched to the bottom mirror material. The quantum dots are embedded in aluminum gallium arsenide or GaAs to form a quantum well. The top mirror will consist of a stack of dielectric material, or possibly air gaps.

The electrical field is supplied by contacts 12 on the top surface and a contact 13 to the 1300 nm VCSEL bottom mirror, which may serve as ground.

The complete structure described above may be grown in one run and on one substrate and there is no need to fuse any of the semiconductor layers.

Several variations of the invention are possible. The invention may apply to other semiconducting material systems, the mirrors may both be dielectric, and in such a case the pump VCSEL top mirror may serve as ground.

It may be possible not to use quantum dots for the active layer if in the future homogenous 1300 nm active layers can be grown lattice matched to gallium arsenide. Another variation is to grow or to fuse the 980 nm pump VCSEL onto an indium phosphide substrate containing the 1300 nm bottom mirror and the active layers.

The invention meets the need for a 1300 nm light emitting device that may compete successfully with traditional 1300 nm edge-emitting laser diodes that are notoriously expensive.

The invention is applicable to other semiconducting material systems. If no fusion is employed, the pump VCSEL top mirror may serve as ground. The active layer can also consist of 1300 nm strained InGaAsP quantum wells lattice matched to GaAs or AlGaAs.

If fusion is employed, the top layer may be made of InP with InAs quantum dots or alloys thereof, or InP/InGaAsP strained quantum wells or alloys thereof. The top mirror is a dielectric. The bottom mirror is an InP/InGaAsP quarter-wavelength stack, the InP buffer layer, and the bottom VCSEL structure remain the same. Fusion is accomplished between the InP and GaAs buffer layer.

What is claimed is:

1. A vertical cavity surface emitting laser (VCSEL) diode structure, comprising top and bottom mirrors defining a first laser cavity containing a laser medium and designed to resonate at a first wavelength, at least one of said mirrors being electrically non-conductive; and a second laser cavity designed to resonate at a second wavelength less than said first wavelength, said second laser cavity being optically coupled to said first laser cavity so as to optically pump said laser medium and create laser action in said first laser cavity, said top mirror of said first laser cavity comprising a stack of dielectric material, said dielectric material being selected from the group consisting of: silicon dioxide and silicon nitride.

2. A structure as claimed in claim 1, wherein the second laser cavity is provided by a VCSEL stacked below said first laser cavity and having conductive mirrors to permit pumping by carrier injection.

3. A structure as claimed in claim 1, wherein the top mirror is made of an airgap-based stack.

4. A structure as claimed in claim 1, wherein said bottom mirror is made from a material selected from the group consisting of: gallium arsenide and an alloy thereof.

5. A laser (VCSEL) diode structure, comprising top and bottom mirrors defining a first laser cavity containing a laser medium and designed to resonate at a first wavelength, at least one of said mirrors being electrically non-conductive; and a second laser cavity designed to resonate at a second wavelength less than said first wavelength, said second laser cavity being optically coupled to said first laser cavity so as to optically pump said laser medium and create laser action in said first laser cavity, said top mirror of said first laser cavity comprising a stack of dielectric material, wherein said laser medium consists of indium gallium arsenide phosphide quantum dots or an alloy combination thereof embedded in GaAlAs or GaAs or that emits at 1300 nm and said quantum dots are grown lattice mismatched to the material forming the bottom mirror.

6. A structure as claimed in claim 1, further comprising contacts for applying an external electric field to the laser medium to change the bandgap.

7. A structure as claimed in claim 6, wherein said contacts are arranged to apply said field perpendicular to the laser medium.

8. A structure as claimed in claim 7, wherein in one of said contacts is located on the top mirror, and the other of said contacts is located laterally adjacent the active medium.

9. A structure as claimed in claim 1 wherein both mirrors are dielectric.

10. A structure as claimed in claim 1, wherein the laser medium comprises 1300 nm InGaAsP quantum wells lattice matched to GaAS or AlGaAs.

11. A structure as claimed in claim 1, wherein the laser medium comprises a top active layer of InP with InAs quantum dots or alloys thereof, or InP/InGaAsP strained quantum wells or alloys thereof.

12. A structure as claimed in claim 1, wherein the bottom mirror is an InPGaAsP quaterwavelength stack.

* * * * *